United States Patent [19]

Marcoux et al.

[11] Patent Number: 4,575,402

[45] Date of Patent: Mar. 11, 1986

[54] METHOD FOR FABRICATING CONDUCTORS IN INTEGRATED CIRCUITS

[75] Inventors: Paul J. Marcoux, Mountain View, Calif.; Eileen M. Murray; Hugh R. Grinolds, both of Yokohama, Japan

[73] Assignee: Hewlett-Packard Company, Palo Alto, Calif.

[21] Appl. No.: 701,270

[22] Filed: Feb. 13, 1985

[51] Int. Cl.$^4$ .................. B44C 1/22; C03C 13/00; C03C 25/06; C23F 1/02
[52] U.S. Cl. ..................................... 156/643; 29/591; 156/646; 156/652; 156/656; 204/192 E; 427/88; 357/65
[58] Field of Search ............... 29/580, 591; 156/643, 156/644, 646, 651, 652, 653, 655, 656, 657, 659.1, 661.1, 662, 904; 204/192 EC, 192 E; 427/38, 39, 88; 430/313, 314, 315, 316, 317, 318; 357/65, 68

[56] References Cited

U.S. PATENT DOCUMENTS

| | | | |
|---|---|---|---|
| 4,251,319 | 2/1981 | Bonnie et al. | 156/656 |
| 4,307,179 | 12/1981 | Chang et al. | 156/656 X |
| 4,532,002 | 7/1985 | White | 156/643 |
| 4,541,892 | 9/1985 | Jeuch | 156/643 |

Primary Examiner—William A. Powell
Attorney, Agent, or Firm—Edward Y. Wong

[57] ABSTRACT

A technique of patterning a conductive layer for interconnections in integrated circuits is disclosed. The technique enables fine line conductors to be fabricated. In accordance with the invention, a pattern for the conductors is etched into the surface of a substrate through the use of a patterned photoresist layer. The conductive layer is then deposited over the photoresist layer and into the pattern etched into the substrate surface. In intervening steps, only the portions of the conductive layer outside the depression of the pattern in the surface are removed; the portions of the conductive layer within the depression remains intact to provide the pattern of fine line conductors desired.

5 Claims, 20 Drawing Figures

METHOD FOR FABRICATING CONDUCTORS IN INTEGRATED CIRCUITS

BACKGROUND AND SUMMARY

In recent technology, fabrication of integrated circuits has advanced greatly with, inter alia, new photolithographic processes to result in more densely packed integrated circuits. Concomitant with denser circuits, however, is the requirement of fine line conductors for interconnections. To meet this requirement, several techniques have been proposed in the prior art. These techniques proposed and used, however, all have evidenced some inherent disadvantages.

A prevalent technique in the prior art for fabricating fine line conductors is the use of plasma etching to pattern conductors in integrated circuits. To transfer a photolithographic pattern by plasma etching, a reactive low pressure glow discharge is used to etch the pattern onto a conductor layer. This approach, however, does limit the nature of the material to be the conductors, for the material must in fact be etchable. Unfortunately, not all useful conductor materials can be etched. This technique therefore requires the development of a separate anisotropic etch for each material to be patterned. Furthermore, this technique has strict requirements on the selectivity of the conductor etch with respect to the patterning layer and to any underlying films that are used in the integrated circuit fabrication process. Otherwise, both patterning layer and underlying films would be indiscriminately etched. All these restrictions and requirements limit the usefulness of this technique.

Another prior art technique is the "lift-off" technique. This technique has been described in U.S. Pat. No. 4,004,044, "Method for Forming Patterned Films Utilizing a Transparent Lift-off Mask," issued to Franco et al. The lift-off technique for patterning, for example a conductive layer or film, comprises the deposition of a first organic polymeric masking layer on a substrate, typically by spin coating. This masking layer is the lifting layer and must be easily removed during the lifting step. A second masking layer, which may actually comprise one or two layers depending on the specific process used, is deposited on the lifting layer. The second masking layer is patterned using standard lithographic techniques or special lithographic techniques like photolithography, E-beam lithography, or X-ray lithography to produce exposed regions in the first layer. Using the top layer as a mask, the first layer resin is patterned using either wet development or plasma etching. The patterning of the lower layer necessarily produces openings that are somewhat larger than those in the top layer in order to form a reentrant resist profile. It is this reentrant profile that is used to facilitate the lift-off of the film that is subsequently deposited over the resist layers. The lift-off process leaves behind the portions of the deposited film that was deposited in the exposed areas, and in this manner the deposited film is patterned as desired.

One drawback to this lift-off technique is its very dependence on maintaining a reentrant resist profile. This profile requires careful control of all aspects of the resist patterning process. If the resist process cannot produce a reentrant profile, the conductive layer cannot be successfully lifted. Another drawback is that the requirement for a reentrant profile places an additional limit on patterns of lines and spaces: not only does the space need to allow room for the reentrant profile, it also needs to maintain its mechanical integrity. Still another drawback occurs when the area to be patterned is a small fraction of the total substrate area; the lift-off technique is particularly difficult because d solution of the lifting layer must extended several hundreds of times the film thickness. Yet this is precisely the case when the lift-off technique is called upon to define contacts, via plugs, and gates. Thus, these disadvantages in the lift-off technique have inhibited its wider use.

Still another prior art technique for patterning a layer is the anodization technique. In this technique, a conducting layer on a substrate is patterned with a nonconducting layer of, for example, silicon dioxide. The substrate is placed in an electrolytic cell, and the oxide of the conductive layer is grown in the exposed area by letting the conductive layer act as the anode of the cell. However, this technique is also not devoid of disadvantages. For example, this technique is capable of only patterning features that have good conductive properties, since the patterning layer must act as the anode of the cell. Furthermore, the minimum feature size that can be patterned with this technique is typically too large for very large scale integration (VLSI) circuits. In addition, because of the nature the technique, it is also limited to patterning features to which electrical connection can be maintained in partially fabricated circuits. This fact severely limits the design of integrated circuits using this technique.

To avoid such limitations and disadvantages of these prior art techniques, the technique in accordance with the invention has been developed. This technique initially forms a depression of the pattern in the surface of a substrate, typically by etching the pattern into the surface by means of a photoresist layer containing the pattern. In the illustrated embodiment, an initial layer of photoresist material is deposited onto the surface, and the pattern is defined on the photoresist layer by removing the pattern areas. The pattern is then transferred to the surface of the substrate, and a depression of the pattern is formed in the surface. Next, a first layer of conductive material, for example, a metallic film, is deposited over the photoresist layer and the pattern depression, to which the conductive layer conforms. At this point, the surface is nonplanar because of the pattern and the conforming film. Therefore, a second layer of planarizing material, such as photoresist, is next deposited to make the surface substantially planar. This layer is then uniformly removed, such as by etching, until the upper part of the first layer is exposed; the portions of the first layer in the depressed pattern remain covered and protected by remnants of the planarizing layer. The exposed layer is removed, usually by isotropic etching, until the initial photoresist layer is reached. Finally, the remnants of the planarizing layer and the initial photoresist layer are removed, and the remaining portions of the first layer, which now conforms to the pattern, are left behind to provide a patterned film or layer. And in the illustrated embodiment, this patterned layer is a patterned conductive metallic film to provide fine line conductors.

BRIEF DESCRIPTION OF THE DRAWINGS

FIG. 1A shows the postmask profile, FIG. 1B shows the etched dielectric profile, FIG. 1C shows the conductor deposition profile, FIG. 1D shows the planarization profile, FIG. 1E shows the etchback profile, FIG. 1F shows the conductor etch profile, and FIG. 1G shows the resist strip profile.

FIGS. 2A-2G represent profiles similar to FIGS. 1A-1G, respectively, and FIG. 2H shows the second dielectric etch profile.

DETAILED DESCRIPTION OF THE INVENTION

Figure 1A:
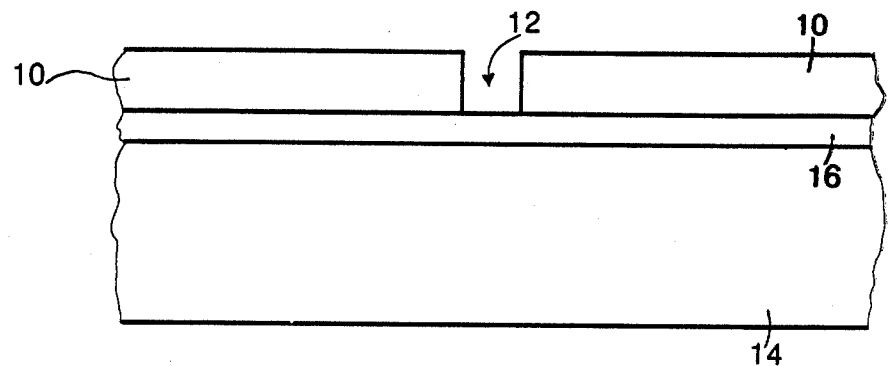
FIGS. 1A–1G show the intermediate profiles of a substrate processed in accordance with the invention. Specifically.
Figure 1B:
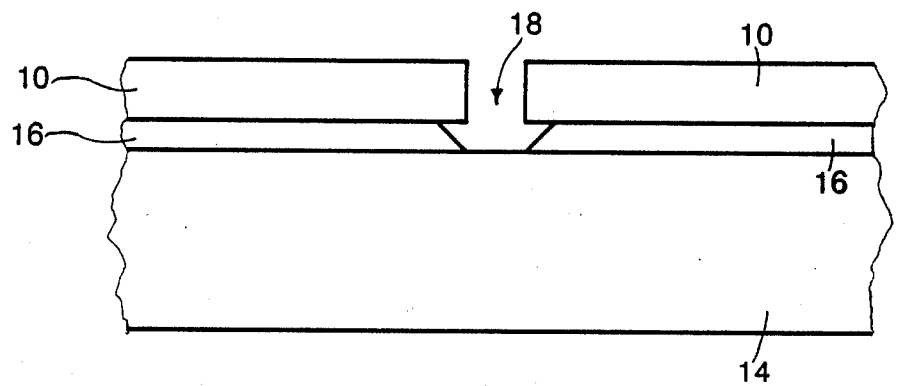
Figure 1C:
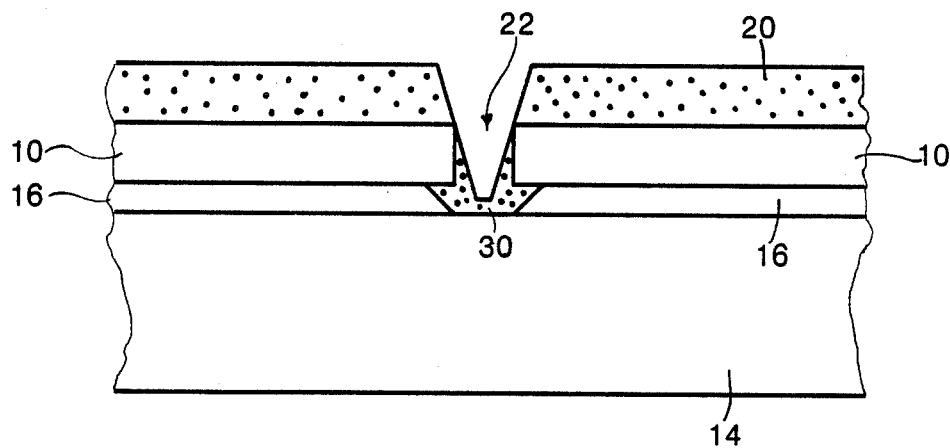
Figure 1D:
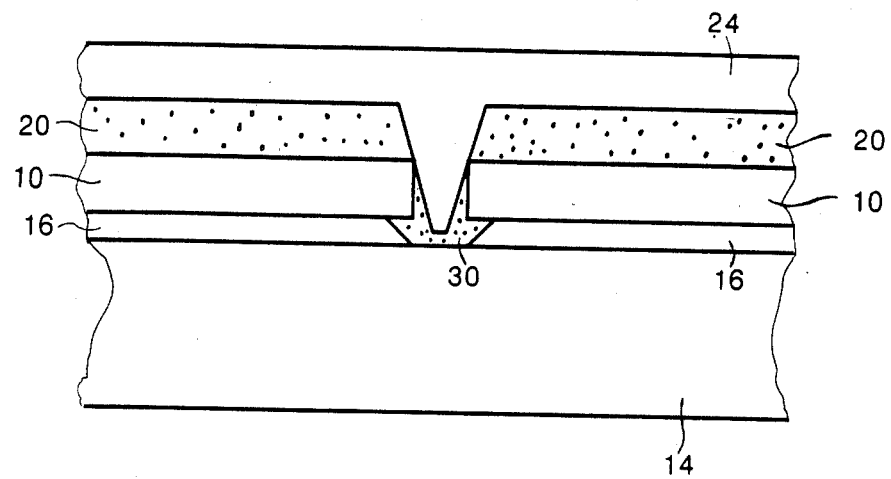
Figure 1E:
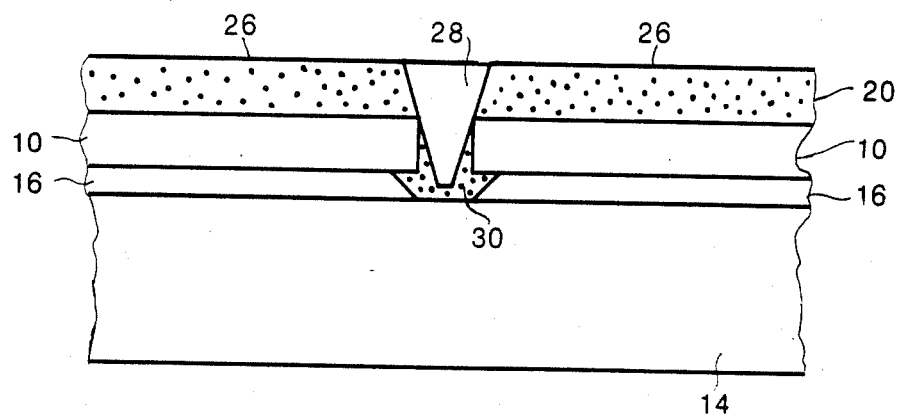
Figure 1F:
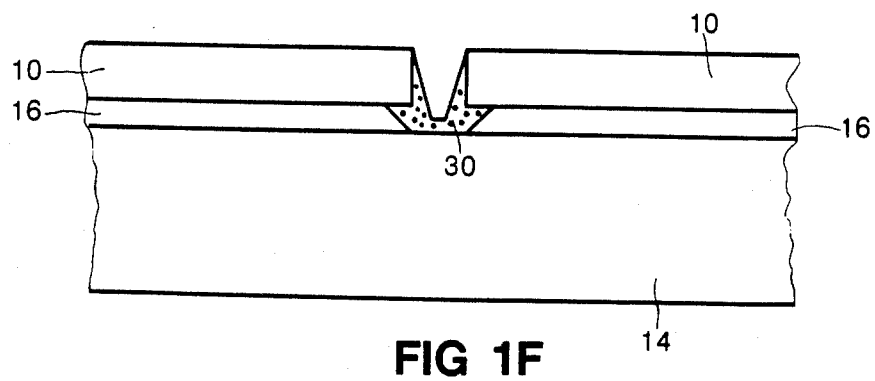
Figure 1G:
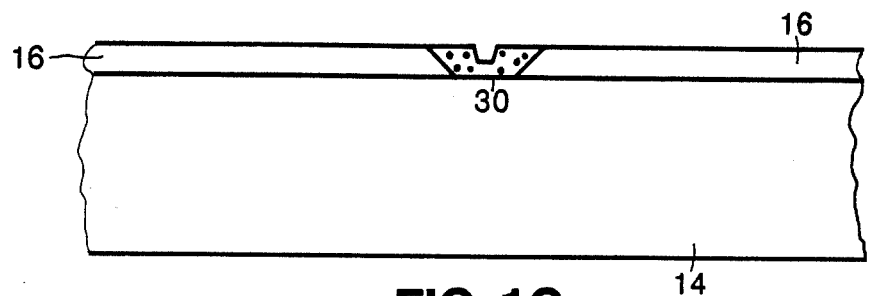
Figure 2A:
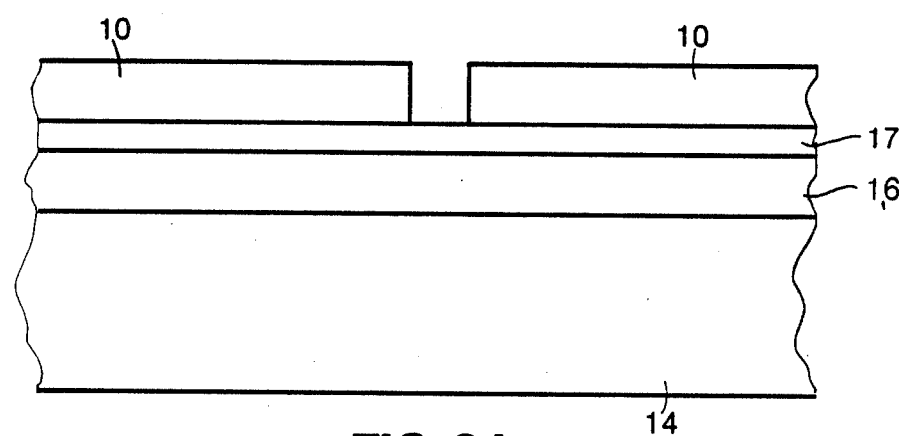
FIGS. 2A-2H show the intermediate profiles of a substrate having two dielectric layers being processed in accordance with the invention.
Figure 2B:
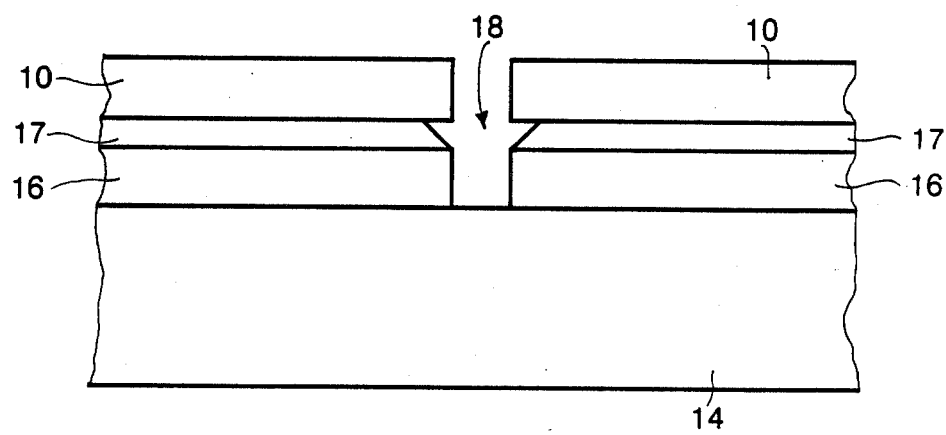
Figure 2C:
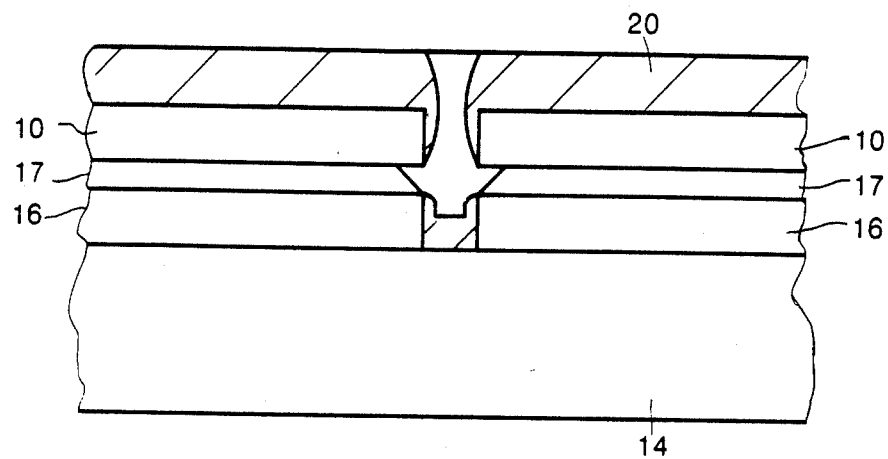
Figure 2D:
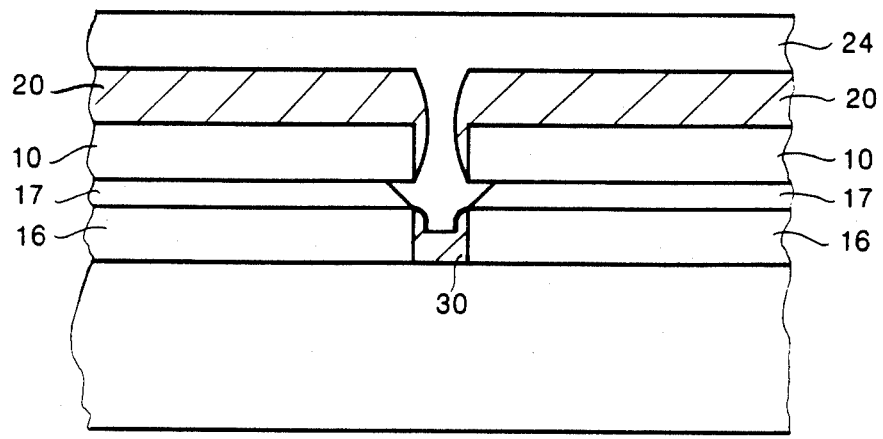
Figure 2E:
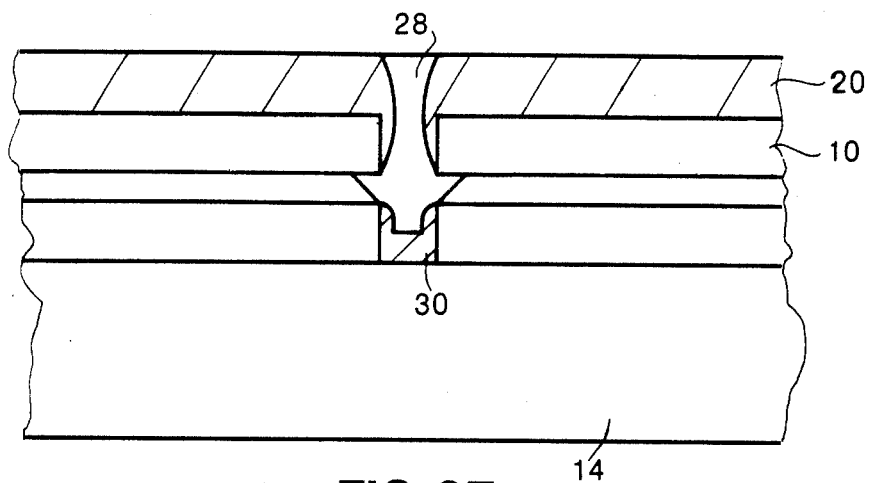
Figure 2F:
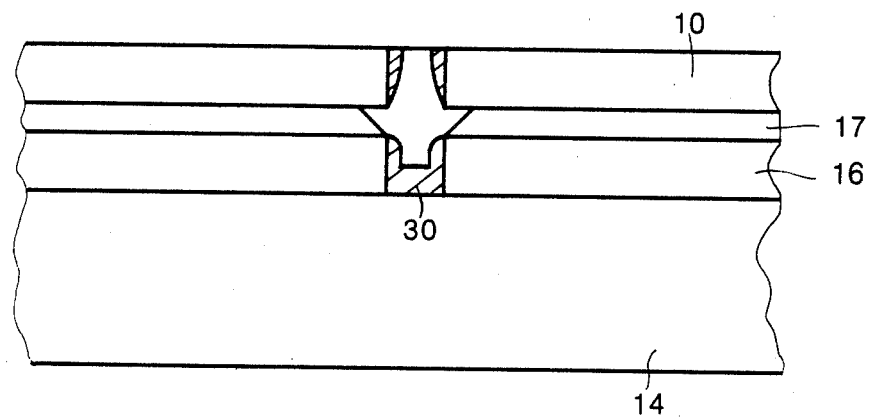
Figure 2G:
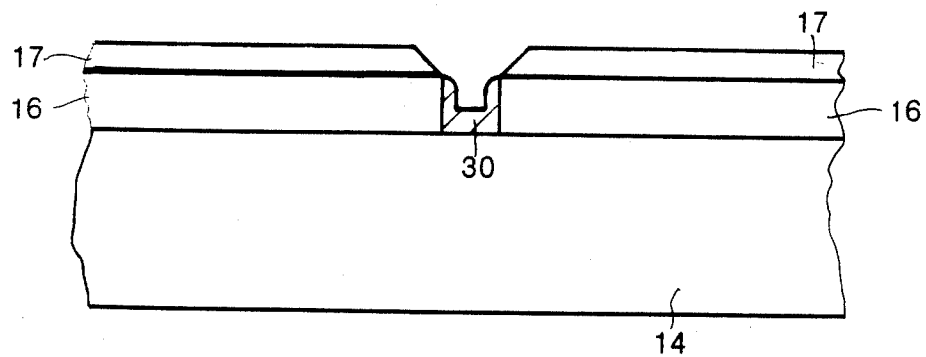
Figure 2H:
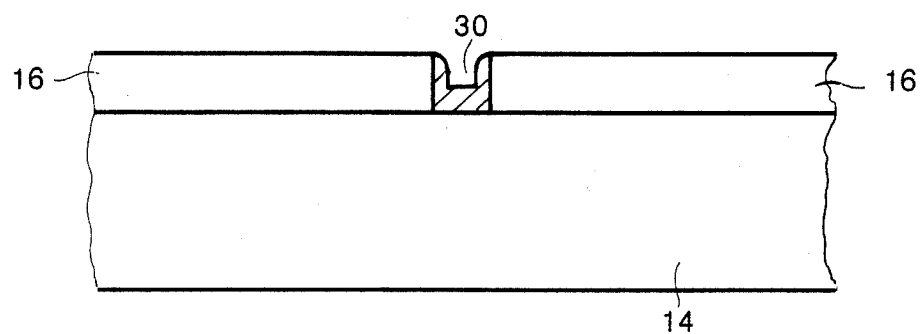

In the illustrated embodiment of the invention as represented by FIGS. 1A-1G, fine line conductors are realized through a series of steps. And although the technique in accordance with the invention described herein are ideally suited for processing conductors, it is by no means restricted to such use. This will be evident as the technique is described.

In accordance with the invention depicted in FIGS. 1A-1G, photoresist 10 is used to define a pattern 12 on the surface of a substrate 14. The resist 10 is removed from those areas 12 where the pattern is to be defined. In the illustrated embodiment, the surface comprises a layer of a dielectric material 16. This underlying dielectric layer 16 is then anisotropically etched, and the pattern defined in the photoresist layer is transferred to the dielectric layer 16. The dielectric layer 16 is then briefly etched isotropically to provide a reentrant profile 18. A layer of conductive material 20, which is to be patterned, is then deposited over the patterned resist and is made to conform to the pattern 18 in the dielectric layer 16. As is typical of such deposition processes, full coverage of the reentrant profile does not occur, and a gap 22 in the conducting layer between the patterned and unpatterned areas is formed. This gap 22 facilitates the later removal of the conducting layer in the unpatterned areas 20. A relatively thick layer 24 of planarizing material, such as photoresist, is then spun over the surface. The planarizing layer 24 is uniformly removed, for example by plasma etching, until the top 26 of the conductive layer over the patterned photoresist layer is exposed. This leaves planarizing material 28 overlying the portions of the conductive layer 30 in the depressed pattern areas for protection in the next process step. The conductive layer 20 is then selectively removed with an isotropic etch. However, the portions of the conductive layer 30 in the depressed pattern areas are not etched; the planarizing material 28 protects the patterned regions from the etch. This technique, then, in effect allows the conductive layer 20, or any other layer in kind, to be selectively removed.

To complete the fabrication process, remnants of the initial photoresist layer 10 and the planarizing layer 28 are removed following the etch. What remains is a patterned conductive layer 30, which can be fine line conductors in an integrated circuit. As is evident from the description, the technique in accordance with the invention achieves fine line patterning without requiring either an anisotropic etch of the material to be patterned or a lift-off of a layer to define a pattern on another layer and their inherent disadvantages. Moreover, this novel technique aids in realizing a planar surface and can be used repeatedly to define multiple levels of patterned layers.

As shown in FIGS. 2A-2H, the technique in accordance with the invention can be used to process a substrate 14 having several dielectric layers 16, 17, for example, an additional second dielectric layer 17 to serve as a spacer. In this illustrated embodiment, an isotropic etch of the spacer layer 17 provides a controlled reentrant etch profile 18 to aid in the removal of the unwanted portions of the conductive layer 20. After the conductor pattern 30 is defined, the spacer layer 17 is then removed.

The technique in accordance with the invention can be used to create contact or via plugs in a multilevel metallization process. In such an application, the technique is used to fill contact and via holes in a manner similar to that depicted by FIGS. 1A-1G and FIGS. 2A-2H to allow interconnecting metallic layers to maintain planarity. Furthermore, the technique allows the metallic layers in the plugs to be tailored for specific applications. For example, the plug can serve as diffusion barriers as well as etch stop layers. The etch stop layers can be used to allow the contact or via areas to overlap metal lines. In this manner, greater device density can be realized.

Figure 3A:
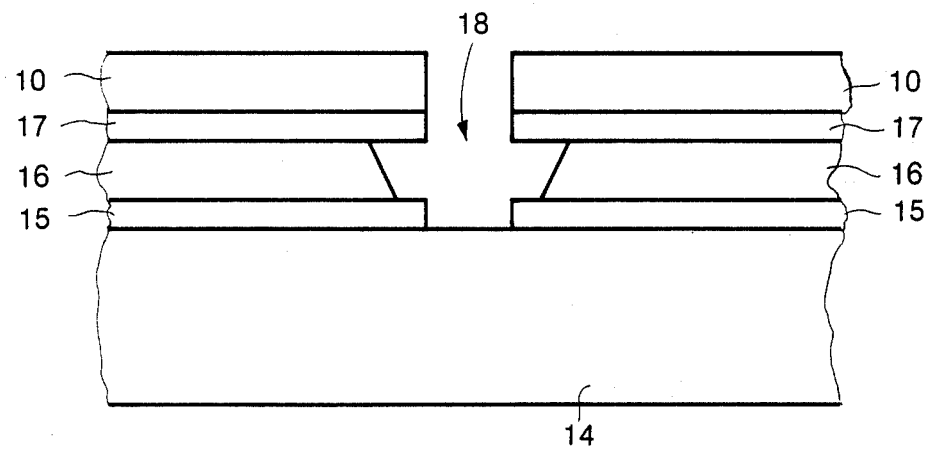
FIGS. 3A-3E illustrate the process in accordance with the invention to realize a device having a self-aligned gate, source and drain.
Figure 3B:
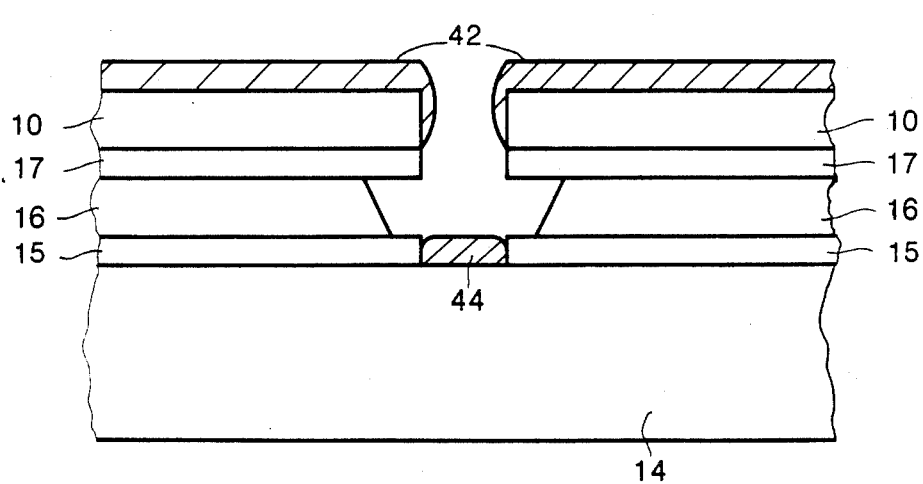
Figure 3C:
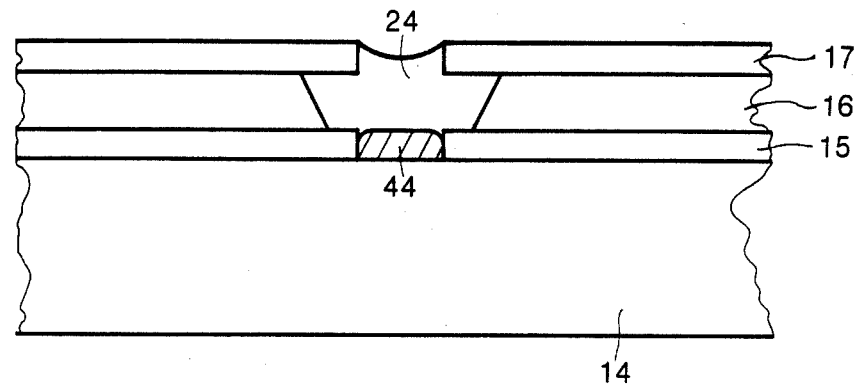
Figure 3D:
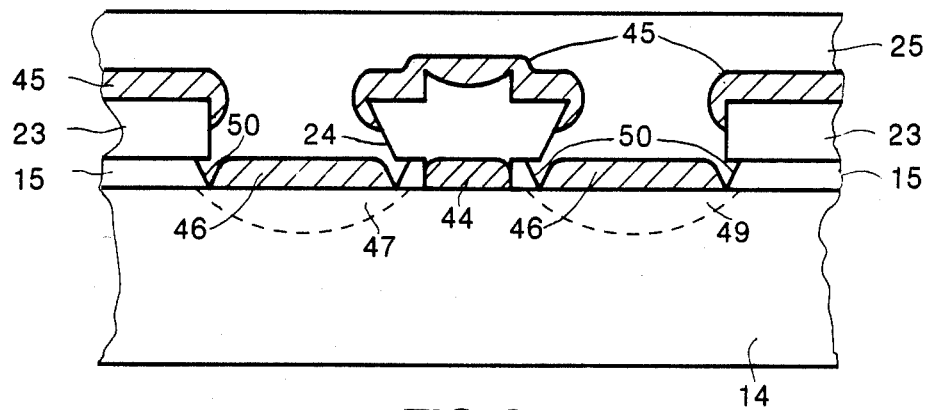
Figure 3E:
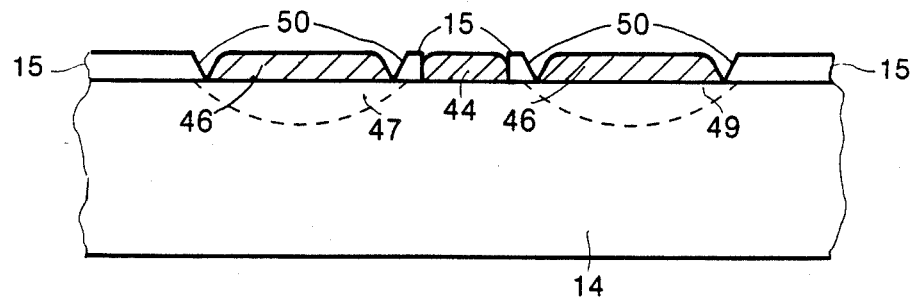

Another application of the technique in accordance with the invention is in the definition of gate electrodes used in compound semiconductor FET's. For this application, either one of the processing sequences outlined in the earlier illustrated embodiments can be followed. The process typically includes an etch of the exposed semiconductor subtrate to form device structures with a recessed gate similar to that illustrated in FIG. 3A. This etch follows the definition of the dielectric layers prior to the deposition of the conducting layer or layers. The conductor forming the gate electrode is not limited to one material; multiple component layers or multiple layers or films can be used to prevent undesired thin film reactions with the underlying semiconductor substrate or with any subsequent interconnecting layers. Furthermore, these multiple layers can be used to form etch stops.

Still another application of the technique in accordance with the invention is for creating self-alignment of the source and drain regions of FET's to the gate electrode. This application is illustrated in FIGS. 3A-3E. Accordingly, three dielectric layers 15-17 are deposited on a semiconductor substrate 14. An initial photoresist layer 10 is used to define the dielectric layers so that the second dielectric layer 16 forms a reentrant edge profile 18 similar to that shown in FIG. 2B. Typically, this second dielectric layer 16 is thicker than that shown in FIG. 2B. After a definition of the dielectric layers 15-17, an optional etch of the semiconductor substrate can be made. Conductive layers 42 are then deposited to the initial photoresist layer 10 and reentrant profile 18, a portion 44 of which only partially fills the defined depression or trench in the semiconductor substrate 14. Another resist 24 is next applied to completely fill the trenches 18 and to planarize the surface. Materials other than resist material can be used if the material possesses sufficient etch resistance with respect to the conducting layers 42 and if the material fills the reentrant space 18. The planarizing layer 24 is then etched back to expose the top or high portions of the conductive layers 42, and these portions of the conductive layers 42 are removed and the portions of the conductive layers 44 in the trenches are allowed to remain. The initial resist layer 10 is then etched back until the third dielectric layer 17 is exposed. Even if resist 24 were used to fill the trench and to planarize the surface, the removal of the resist layer 24 can be sufficiently controlled such that the conductor layer 44 in the trench, a gate electrode 44, remains protected. The second and third dielectric layers 16, 17 are then removed nonselectively. Resist 23 is spun over the semiconductor surface, and the resultant resist layer 23 is masked to define a source area 47 and a drain area 49 by etching the first dielectric layer 15, which is etched with some desirable undercut 50. The protective structure 24 over the gate electrode 44 thus precisely defines a separation between the source and drain regions 47, 49. The original thickness of the second dielectric layer 16 determines the shape and the extent of protection of the gate electrode 44 during the etch of the first dielectric layer 15. If desired, the source and drain regions 47, 49 can then be implanted. Suitable conductive layers 45 are deposited, a portion 46 which is made to contact the exposed semiconductor source and drain regions 47, 49. A planarizing layer 25 of, for example, resist is applied and etched back to expose the top portions of the conductive layer or layers 45. The resist layers 23, 24 over the gate 44, source 47, and drain 49 regions are finally removed to provide self-aligned source and drain contacts 46.

We claim:

1. A process for selectively patterning a layer on a surface comprising the steps of:

depositing an initial layer onto the surface;

removing portions of the initial layer to form a select pattern on the initial layer;

transferring the select pattern onto the surface by forming a depression of the pattern in the surface to result in a nonplanar surface;

depositing a first layer to be patterned onto the patterned initial layer such that the first layer partially fills the depression on the nonplanar surface;

depositing a second layer of planarizing material onto the first layer to form a substantially planar surface and completely filling the depression to form a substantially planar surface;

uniformly removing the second layer until the uppermost portions of the first layer is exposed, leaving remnants of the second layer in the depression to protect those portions of the first layer in the depression;

removing portions of the exposed first layer; and removing remnants of the second layer and the initial layer to provide a selectively patterned first layer.

2. The process as in claim 1, wherein the step of depositing an initial layer comprises depositing a layer of photoresist and the step of transferring comprises etching the pattern onto the surface to form the depression in the surface.

3. The process as in claim 2, wherein the step of depositing a first layer comprises depositing a layer of conductive material.

4. The process as in claim 3, wherein the step of depositing a second layer comprises depositing a layer of resist material.

5. The process as in claim 4, wherein the step of uniformly removing the second layer comprises plasma etching the second layer.

* * * * *